United States Patent

Newcomb, Jr. et al.

[15] 3,670,253

[45] June 13, 1972

[54] A.C. POWER AMPLIFIER

[72] Inventors: Arthur L. Newcomb, Jr., Route 4, P.O. Box 321, Yorktown, Va. 23490; Richard N. Young, 7 Hondo Court, Hampton, Va. 23369

[22] Filed: June 18, 1970

[21] Appl. No.: 47,441

[52] U.S. Cl. ..........................330/17, 330/30 D, 330/207 P

[51] Int. Cl. ..........................H03f 3/18

[58] Field of Search ..................330/17, 26, 30, 30 D, 69, 28, 330/207 P

[56] References Cited

UNITED STATES PATENTS

| | | | |
|---|---|---|---|
| 3,562,660 | 2/1971 | Pease | 330/17 |
| 3,471,794 | 10/1969 | Gugliotti, Jr. | 330/30 X |

*Primary Examiner*—Roy Lake
*Assistant Examiner*—Lawrence J. Dahl
*Attorney*—Howard J. Osborn, William H. King and John R. Manning

[57] ABSTRACT

A high power, low distortion, A.C. power amplifier for laboratory and special applications.

5 Claims, 1 Drawing Figure

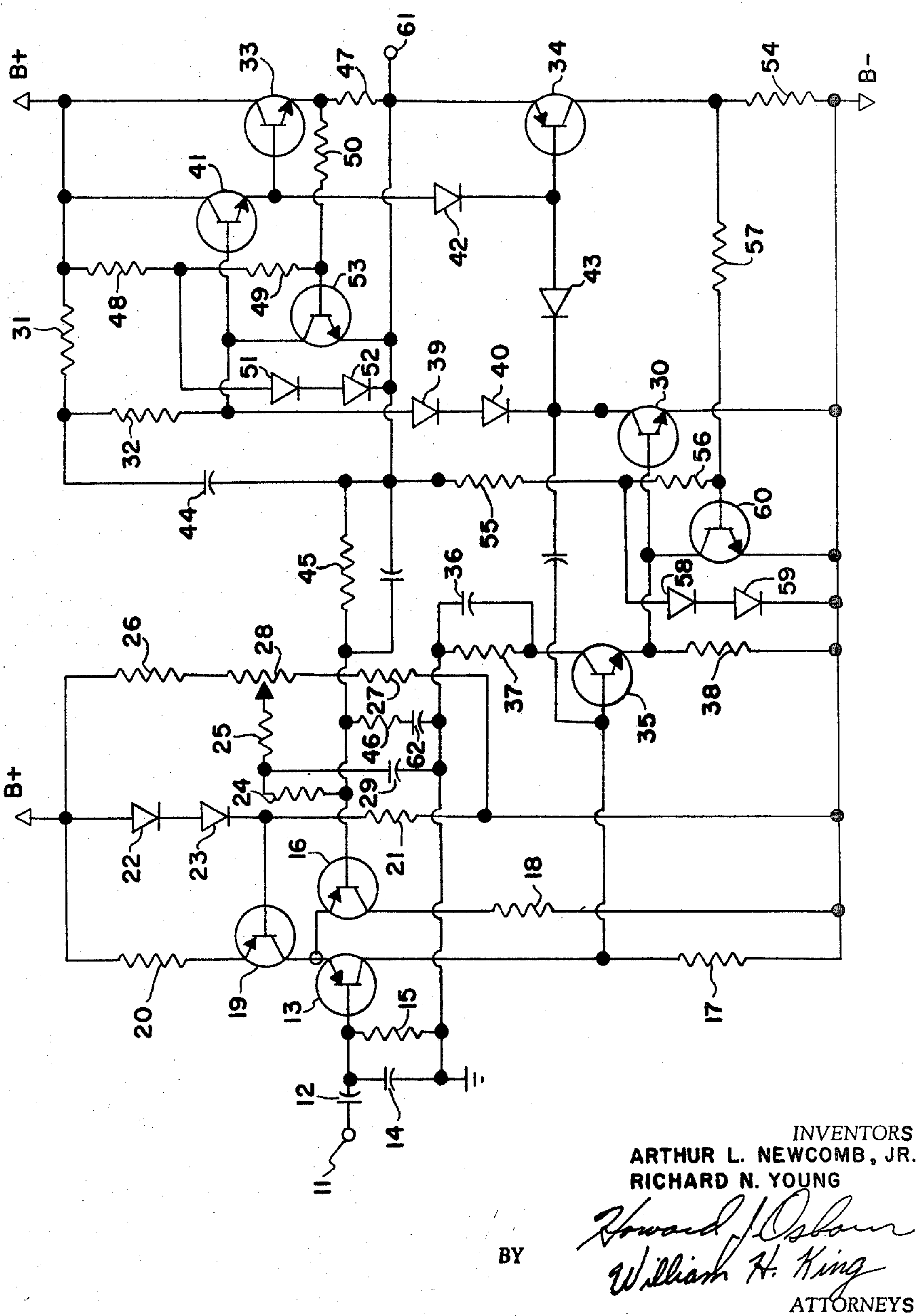
INVENTORS
ARTHUR L. NEWCOMB, JR.
RICHARD N. YOUNG
BY Howard J. Osborn
William H. King
ATTORNEYS

A.C. POWER AMPLIFIER

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

Although many circuit designs similar to the one in the present invention have been made, distortion levels remain moderately high and high quality, high power units are still rather costly. Replacement of faulty transistors, in most designs, must be done only with carefully selected units and by adjustments made subsequent to replacement. Some prior designs are vulnerable to short circuited outputs during operation in that destruction of output transistors may take place in addition to blowing of fuses and other protective devices. It is the primary purpose of the present invention to provide a high power low distortion A.C. power amplifier which does not have the limitations of previous A.C. power amplifier circuits.

BRIEF DESCRIPTION OF THE DRAWING

The sole FIGURE in the drawing is a schematic diagram of a preferred embodiment of the invention.

DETAILED DESCRIPTION OF THE INVENTION

The input to the amplifier which is applied to input terminal 11 is applied through a capacitor 12 to the base of a PNP-transistor 13. Capacitor 14 provides open circuit stability and resistor 15 establishes the ground reference for the amplifier. Transistor 13 along with another PNP-transistor 16 form a differential pair having their collectors connected to the B− power supply through resistors 17 and 18, respectively. The emitters of transistors 13 and 16 are connected to a constant current network consisting of a PNP-transistor 19, resistors 20 and 21, and diodes 22 and 23. Base to emitter differences between transistors 13 and 16 are nulled out by the network formed by resistors 24, 25, 26, and 27, and potentiometer 28. Potentiometer 28 is the adjustment for offset and a capacitor 29 decouples power supply fluctuations from the null bias. The entire balance network may be eliminated where small offset voltages (generally less than 200 millivolts) can be tolerated.

An NPN-transistor 30 in combination with resistors 31 and 32 functions as a voltage amplifier which in turn drives the complimentary output transistors 33 and 34. An NPN-transistor 35 along with capacitor 36 and resistors 37 and 38 provide a very low impedance drive source for transistor 30. The amplifier is biased class C with diodes 39 and 40 holding an NPN-transistor 41 in a quiescently off condition and a diode 42 which is connected between the bases of transistors 33 and 34 maintain transistors 33 and 34 quiescently off. Transistor 41 provides sufficient current gain to drive transistor 33 on while transistor 30 is adequate to drive transistor 34. The diode 42 functions also to turn off either output transistor 33 or 34 when its complement is being driven. A diode 43 isolates transistor 34 from the voltage amplifier formed by transistor 30 during positive output signals. A capacitor 44 and resistor 32 provide a constant current drive source for transistors 41 and 33. The voltage gain of the amplifier is determined by the ratio of resistance of a resistor 45 and the resistance of a resistor 46.

A unique power limiting circuit is formed by resistors 47, 48, 49, and 50, diodes 51 and 52 and an NPN-transistor 53 (and its counterpart circuit for negative swings resistors 54, 55, 56, and 57, diodes 58 and 59, and an NPN-transistor 60). The circuit senses transistor 33 current through resistor 47 and the voltage across transistor 33 via resistor 48 and diodes 51 and 52. Where voltage is low across transistor 33, high currents are allowed but as the voltage increases and approaches maximum the allowed current through transistor 33 and resistor 47 decreases to a value which is determined by the values of resistors 48, 49 and 50. The diode pair 51 and 52 determines the inflection point of the output voltage versus output current curve for transistor 33 and may be any combination of any conventional diodes or a zener diode. Operation of the power limiting circuit (which refers to a dissipated power in the output transistors rather than output power) is very effective allowing full output into predetermined low impedances while affording short circuit protection at all signal levels. This permits high voltage devices to be used at their rated voltages without functioning outside their safe operating mode. In applications where operation within the safe operating mode can be maintained with simple current-limiting, resistors 48, 49, 55, and 56, and diodes 51, 52, 58, and 59 may be omitted.

In the operation of this invention assume that a positive input is applied to input terminal 11. Then the transistor 13 becomes less conductive causing the collector of transistor 13 to become more negative, resulting in transistor 35 becoming less conductive which causes a decrease in voltage at its emitter. This decrease in voltage causes transistor 30 to become less conductive raising the voltage of the base of transistor 41, thus causing transistors 41 and 33 to become more conductive thereby increasing the voltage at the output terminal 61. The voltage at the base of transistor 16 is proportional to the output voltage times the ratio of the resistance of resistor 45 to the resistance of resistor 46. The increase in voltage at the emitter of transistor 41, in addition to causing transistor 33 to become more conductive, passes through diode 42 and causes transistor 34 to become less conductive. As was discussed earlier, the circuitry including transistor 53 and diodes 51 and 52 limits the power dissipated in the output transistor 33. If the input at input terminal 11 is negative then the collector of transistor 13 becomes more positive which causes transistor 35 to become more conductive. This results in a rise in the emitter voltage of transistor 35 causing transistor 30 to become more conductive. The resulting decrease of voltage at the collector of transistor 30 passes through diode 43 to the base of transistor 34 causing it to become more conductive which results in a decrease in voltage at the output terminal 61. The decrease of voltage at the base of transistor 34 is also applied through diode 42 to the base of transistor 33 causing it to become less conductive. The power limiting circuit including transistor 60 and diodes 58 and 59 limits the power dissipated in the output transistor 34 as discussed above.

The circuit shown uses all silicon devices with the exception of transistor 34 which is germanium. Use of a silicon device for transistor 34 may necessitate a third diode in series with diodes 39 and 40 and another in series with diode 42 to minimize tendencies toward crossover distortion.

This invention has many advantages. It is stable working into any and all load impedances and will maintain a symmetrical output with normal supply voltage fluctuations; that is, the voltage at the output is always referenced at ground potential. This stability is also present during rather extreme temperature variations since regulation is independent of transistor 35 and transistor 30 base to emitter junction or gain variations. Any component in the circuit can be replaced with a comparable working device without adjustment or loss in performance characteristics. Since all signal feedback is taken directly from the output, start-up transients are reduced to a minimum due to the constant current generator transistor 19, which provides control with only 3 to 4 volts applied between B+ and B−. Due to its inherent stability the amplifier may be used in applications requiring D.C. operation by the elimination (by shorting) of capacitor 12 and capacitor 62 (a D.C. constant current source may be needed in place of capacitor 44). The amplifier exhibits an extremely low output impedance on the order of 10 milliohms or less, which makes it very useful in servo and laboratory applications. Class C performance provides minimum quiescent dissipation and therefore maximum efficiency for a linear amplifier. In addition, extremely fast switching and slewing rates are possible in this type of class C operation.

What is claimed as new and desired to be secured by Letters Patent of the United States is:

1. In a power amplifier, a voltage amplifier including: a first resistor, a first diode means, the collector and the emitter of a first transistor connected in series between a positive power supply and a negative power supply with the base of said first transistor being the input to said voltage amplifier;

second and third output transistors that are complementary to each other with the collector of said second transistor, the emitter of said second transistor, a second resistor, the emitter of said third transistor, the collector of said third transistor and a third resistor connected in series between said positive power supply and said negative power supply with the output terminal of the power amplifier being at the junction of said second resistor and said third transistor;

second diode means connected between the base of said second transistor and the base of said third transistor;

third diode means connected between the base of said third transistor and the collector of said first transistor;

first power limiting means connected to the junction of said second transistor and said second resistor and to the base of said second transistor for limiting the current through said second transistor whereby the power dissipated in said second transistor is limited; and a second power limiting means connected to the junction of said third transistor and said third resistor and to the base of said third transistor for limiting the current through said third resistor whereby the power dissipated in said third transistor is limited.

2. A voltage amplifier according to claim 1 wherein said first power limiting means includes:

a fourth resistor, a fifth resistor, and a sixth resistor connected in series between said positive power supply and the junction of said second transistor and said second resistor;

fourth diode means connected between the junction of said fourth and fifth resistors and said output terminal; and means for feeding back the voltage at the junction of said fifth and sixth resistors to the base of said second transistor.

3. In a power amplifier having a transistor in its output circuit with the collector of said transistor, the emitter of said transistor and a first resistor connected in series between a power supply and the output terminal of said power amplifier, means for limiting the power dissipated in said transistor comprising:

a second resistor, a third resistor, and a fourth resistor connected in series between said power supply and the junction of said first resistor and said transistor; diode means connected between said output terminal and the junction of said second resistor and said third resistor to limit the voltage at the junction of said second and third resistors relative to the voltage at said output terminal; and means for feeding back the voltage developed at the junction of said third and fourth resistors to the base of said transistor whereby the power dissipated by said transistor is limited.

4. In a power amplifier according to claim 3 having a second transistor in its output circuit with the emitter of said second transistor, the collector of said second transistor and a fifth resistor connected in series between said output terminal and a second power supply, means for limiting the power dissipated in said second transistor comprising:

a sixth resistor, a seventh resistor and an eighth resistor connected in series between said output terminal and the junction of said second transistor and said fifth resistor;

second diode means connected between said second power supply and the junction of said sixth and seventh resistors to limit the voltage at the junction of said sixth and seventh resistors relative to the voltage at said second power supply; and means for feeding back the voltage developed at the junction of said seventh and eighth resistors to the base of said second transistor whereby the power dissipated by said second transistor is limited.

5. In a power amplifier according to claim 4 wherein third diode means are connected between the bases of the two transistors whereby when one is conducting, the other is made nonconducting.

* * * * *